United States Patent
Akinaga et al.

(10) Patent No.: US 6,873,637 B2
(45) Date of Patent: Mar. 29, 2005

(54) SEMICONDUCTOR LASER ELEMENT INCLUDING OPTICAL WAVEGUIDE LAYERS WHICH HAVE GRADUALLY VARYING BANDGAPS SO AS TO REDUCE ELECTRICAL RESISTANCE AT INTERFACES

(75) Inventors: Fujio Akinaga, Kaisei-machi (JP); Toshiaki Fukunaga, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 150 days.

(21) Appl. No.: 10/436,266

(22) Filed: May 13, 2003

(65) Prior Publication Data

US 2005/0047463 A1 Mar. 3, 2005

(30) Foreign Application Priority Data

May 13, 2002 (JP) ........................................ 2002-136515

(51) Int. Cl.[7] ................................................ H01S 5/00
(52) U.S. Cl. .......................................... 372/45; 372/46
(58) Field of Search ....................................... 372/43–50

(56) References Cited

U.S. PATENT DOCUMENTS 4,974,231 A * 11/1990 Gomyo ........................ 372/45
5,173,912 A * 12/1992 Iwase et al. ................. 372/45

FOREIGN PATENT DOCUMENTS

JP  06-302910 A  10/1994

OTHER PUBLICATIONS

J.L. Wade, et al./ 8.8W CW Power from Broad–Waveguide Al–Free Active–Region (λ=805NM) Diode Lasers/Electronics Letters, vol. 34, No. 11 pp. 1100 May 1998.

* cited by examiner

Primary Examiner—Quyen Leung
(74) Attorney, Agent, or Firm—Sughrue Mion, PLLC

(57) ABSTRACT

In a semiconductor laser element: a lower cladding layer of a first conductive type, a lower optical waveguide layer made of $In_{0.49}Ga_{0.51}P$ which is undoped or the first conductive type, an active layer made of $In_{x3}Ga_{1-x3}As_{1-y3}P_{y3}$ lattice-matching with GaAs ($0<x3 \leq 0.3$ and $0 \leq y3 \leq 0.5$), an upper optical waveguide layer made of $In_{0.49}Ga_{0.51}P$ which is undoped or a second conductive type, and a first upper cladding layer of the second conductive type are formed in this order above the substrate. The lower optical waveguide layer has a bandgap which gradually decreases with elevation within the lower optical waveguide layer, and the upper optical waveguide layer has a bandgap which gradually increases with elevation within the upper optical waveguide layer.

13 Claims, 3 Drawing Sheets

EFFECT OF REDUCING RESISTANCE
ACCORDING TO PRESENT INVENTION

SEMICONDUCTOR LASER ELEMENT INCLUDING OPTICAL WAVEGUIDE LAYERS WHICH HAVE GRADUALLY VARYING BANDGAPS SO AS TO REDUCE ELECTRICAL RESISTANCE AT INTERFACES

BACKGROUND OF THE INVENTION

1. Field of the Invention

The present invention relates to a semiconductor laser element having an $In_{x3}Ga_{1-x3}As_{1-y3}P_{y3}$ active layer which is formed above a GaAs substrate and lattice-matches with GaAs.

2. Description of the Related Art

Recently, high-power semiconductor laser elements are used in the fields of image processing, printing, and medicine. Semiconductor laser elements used in these fields are required to operate with output power from 100 mW to 1 W or higher and high reliability, and there are demands for increasing the output power of the semiconductor laser elements.

Generally, when a semiconductor laser element operates with high output power, the so-called catastrophic optical mirror damage (COMD) occurs, i.e., the end facets are degraded and damaged by high optical density. In the conventional AlGaAs-based semiconductor lasers, non-radiative recombination is likely to occur due to the inclusion of Al. Therefore, currents generated by the non-radiative recombination generate heat, and the temperature at the end facet rises. Since the temperature rise at the end facet decreases the energy gap, the number of non-radiative recombination centers increases. Thus, the end facets are damaged through the above vicious cycle. This phenomenon is a factor of impeding realization of reliable, high output power operation of the semiconductor lasers.

On the other hand, Electronics Letters, vol. 34, (1998) pp.1100 discloses a InGaP-InGaAsP-based semiconductor laser which does not contain Al. Due to the absence of Al in crystals, the non-radiative recombination centers are less likely to be produced, and therefore the COMD level is high. However, the electrical resistance at the GaAs/InGaP hetero-interface is great. Therefore, the characteristics of the disclosed semiconductor laser element are not satisfactory, and the reliability is low.

In order to solve the above problems, Japanese Unexamined Patent Publication (JUPP) No. 6(1994)-302910 discloses an Al-free semiconductor laser element in which electrical resistance is reduced by using a graded-index type light-carrier-separate-confinement structure and unsymmetrically formed optical waveguide layers. However, due to the miscibility gap, it is impossible to produce crystals having satisfactory quality in the manufacturing process of the semiconductor laser element disclosed by JUPP No. 6(1994)-302910. Therefore, the electrical resistance of the entire semiconductor laser element cannot be effectively reduced. In addition, the electrical resistances at the interface between a GaAs substrate and a cladding layer and the interface between a contact layer and another cladding layer remain great.

SUMMARY OF THE INVENTION

The object of the present invention is to provide a reliable semiconductor laser element which has an oscillation wavelength in the 0.8 μm band, an InGaAsP active layer lattice-matching with GaAs, improved characteristics including improved temperature characteristics, and low resistance at hetero-interfaces.

According to the present invention, there is provided a semiconductor laser element comprising: a substrate of a first conductive type; a lower cladding layer of the first conductive type, formed above the substrate; a lower optical waveguide layer formed above the lower cladding layer, and made of $In_{0.49}Ga_{0.51}P$ which is undoped or the first conductive type; an active layer which is formed above the lower optical waveguide layer, and made of $In_{x3}Ga_{1-x3}As_{1-y3}P_{y3}$ lattice-matching with GaAs, where $0<x3\leq0.3$ and $0\leq y3\leq 0.5$; an upper optical waveguide layer formed above the active layer, and made of $In_{0.49}Ga_{0.51}P$ which is undoped or a second conductive type; and a first upper cladding layer of the second conductive type, formed above the upper optical waveguide layer. In the semiconductor laser element, the lower optical waveguide layer has a bandgap which gradually decreases with elevation within the lower optical waveguide layer, and the upper optical waveguide layer has a bandgap which gradually increases with elevation within the upper optical waveguide layer. When the lattice constant of GaAs is denoted by $a_{GaAs}$, and the lattice constant of the active layer is denoted by $a$, and the absolute value of the amount $(a-a_{GaAs})/a_{GaAs}$ is equal to or smaller than 0.005, the active layer lattice-matches with the substrate.

Since, according to the present invention, the bandgaps of the upper and lower optical waveguide layers are arranged as above in the above layer construction, it is possible to reduce the electrical resistances at interfaces between the optical waveguide layers and the layers adjacent to the optical waveguide layers. Therefore, the electrical resistance of the entire element is reduced, and the electric and temperature characteristics of the semiconductor laser element can be improved.

In addition, since the bandgap of InGaP is great, the difference in the bandgap between the InGaP optical waveguide layers and the InGaAsP active layer can be made greater than the difference in the case where the optical waveguide layers are made of any other material. Therefore, it is possible to suppress leakage of carriers which are injected into the active layer, reduce temperature dependence of the threshold current and the like, and improve the characteristics and reliability.

Preferably, the semiconductor laser element according to the present invention may also have one or any possible combination of the following additional features (i) to (viii).

(i) In the semiconductor laser element according to the present invention: the substrate is made of GaAs; the lower cladding layer and the first upper cladding layer are made of $Al_{z1}Ga_{1-z1}As$ or $In_{0.49}(Ga_{1-z3}Al_{z3})_{0.51}P$ (where $0.6\leq z1\leq 0.8$ and $0.2\leq z3\leq 1$); a first etching stop layer made of GaAs of the first or second conductive type, a current confinement layer of $In_{0.49}(Ga_{1-z2}Al_{z2})_{0.51}P$ of the first conductive type (where $0.05<z2<1$), and a cap layer made of InGaP of the first or second conductive type are formed in this order on the upper optical waveguide layer other than an area of the upper optical waveguide layer corresponding to a current injection region so as to form a stripe groove; and the first upper cladding layer and the cap layer are formed in this order so as to fill the stripe groove and realize an index-guided structure.

Since the above semiconductor laser element has an internal current confinement structure and an index-guided structure with the above composition, an electrode can be formed on the entire upper surface of the contact layer.

Therefore, it is possible to reduce the contact resistance, and improve electric characteristics and reliability.

In addition, since the bandgaps of $Al_{z1}Ga_{1-z1}As$ or $In_{0.49}(Ga_{1-z3}Al_{z3})_{0.51}P$ (where $0.6 \leq z1 \leq 0.8$ and $0.2 \leq z3 \leq 1$), of which the upper and lower cladding layers are made, are great, the formation of the upper and lower cladding layers made of $Al_{z1}Ga_{1-z1}As$ or $In_{0.49}(Ga_{1-z3}Al_{z3})_{0.51}P$ (where $0.6 \leq z1 \leq 0.8$ and $0.2 \leq z3 \leq 1$) is effective for prevention of leakage of carriers.

(ii) The semiconductor laser element having the feature (i) may further comprise, between the upper optical waveguide layer and the first etching stop layer, a second upper cladding layer made of $Al_{z1}Ga_{1-z1}As$ or $In_{0.49}(Ga_{1-z3}Al_{z3})_{0.51}P$ of the second conductive type (where $0.6 \leq z1 \leq 0.8$ and $0.2 \leq z3 \leq 1$), and a second etching stop layer made of InGaP of the second conductive type and formed above the second upper cladding layer. In this case, it is possible to control the width of the stripe groove with high accuracy, and form an index-guided structure with high accuracy.

(iii) In the semiconductor laser element according to the present invention: the substrate is made of GaAs; the lower cladding layer is made of $Al_{z1}Ga_{1-z1}As$ or $In_{0.49}(Ga_{1-z3}Al_{z3})_{0.51}P$ (where $0.6 \leq z1 \leq 0.8$ and $0.2 \leq z3 \leq 1$); the first upper cladding layer is made of $Al_{z1}Ga_{1-z1}As$ (where $0.6 \leq z1 \leq 0.8$); and a ridge stripe is formed by removing portions of layers formed above at least a portion of the upper optical waveguide layer which does not correspond to a current injection region, so that an index-guided structure is realized.

When the semiconductor laser element has a ridge stripe structure and an index-guided structure with the above composition, the index-guided structure can be formed with high accuracy.

(iv) The semiconductor laser element having the feature (iii) may further comprise, between the upper optical waveguide layer and the first upper cladding layer, a second upper cladding layer made of $Al_{z1}Ga_{1-z1}As$ or $In_{0.49}(Ga_{1-z3}Al_{z3})_{0.51}P$ of the second conductive type (where $0.6 \leq z1 \leq 0.8$ and $0.2 \leq z3 < 1$), and an etching stop layer made of InGaP and formed above the second upper cladding layer.

When the etching stop layer is formed above the upper optical waveguide layer, it is possible to control the width of the ridge stripe with high accuracy. In addition, when the second upper cladding layer is formed as above, the difference in the equivalent refractive index can be increased, and therefore it is possible to obtain high-quality laser light.

(v) In the semiconductor laser element according to the present invention: the substrate is made of GaAs; the lower cladding layer is made of $Al_{z1}Ga_{1-z1}As$ or $In_{0.49}(Ga_{1-z3}Al_{z3})_{0.51}P$ (where $0.6 \leq z1 \leq 0.8$ and $0.2 \leq z3 \leq 1$); the first upper cladding layer is made of $In_{0.49}(Ga_{1-z3}Al_{z3})_{0.51}P$ (where $0.2 \leq z3 \leq 1$); an etching stop layer made of GaAs is formed between the first upper cladding layer and the upper optical waveguide layer; and a ridge stripe is formed by removing portions of layers formed above at least a portion of the etching stop layer which does not correspond to a current injection region, so that an index-guided structure is realized.

When the semiconductor laser element has a ridge stripe structure and an index-guided structure with the above composition, the index-guided structure can be formed with high accuracy.

(vi) The semiconductor laser element having the feature (v) may further comprise, between the upper optical waveguide layer and the first etching stop layer, a second upper cladding layer made of $Al_{z1}Ga_{1-z1}As$ or $In_{0.49}(Ga_{1-z3}Al_{z3})_{0.51}P$ of the second conductive type (where $0.6 \leq z1 \leq 0.8$ and $0.2 \leq z3 \leq 1$).

When the second upper cladding layer is formed as above, the difference in the equivalent index can be increased, and therefore it is possible to obtain high-quality laser light.

(vii) in the semiconductor laser element having the feature (i), (iii), or (v), when the stripe width is in the range of 1 to 4 micrometers, it is preferable that the difference in the equivalent refractive index between the portion of the active layer under the stripe groove or the ridge stripe and the other portions of the active layer is in the range of $2 \times 10^{-3}$ to $7 \times 10^{-3}$. In this case, it is possible to realize reliable oscillation in a fundamental transverse mode in a wide output-power range from low to high output power.

(viii) In the semiconductor laser element having the feature (i) (iii), or (v), when the stripe width is greater than 4 micrometers, it is preferable that the difference in the equivalent refractive index between the portion of the active layer under the stripe groove or the ridge stripe and the other portions of the active layer is equal to or greater than $2 \times 10^{-3}$. In this case, it is possible to obtain low-noise laser light even in multiple modes.

In the additional features (vii) and (viii) the stripe width is the width of the stripe groove in a cross section perpendicular to the oscillation direction in the case where the semiconductor laser element has an internal index-guided structure, and the stripe width is the width of the ridge stripe in a cross section perpendicular to the oscillation direction in the case where the semiconductor laser element has a ridge structure.

The equivalent refractive index is an equivalent refractive index in the active layer at an oscillation wavelength in the thickness direction. In the case of the internal stripe structure, when the equivalent refractive index of the region of the active layer which is not located under the current confinement layer is denoted by NA, and the equivalent refractive index of the other regions of the active layer which are located under the current confinement layer is denoted by NB, the difference in the equivalent refractive index is NA−NB. In the case of the ridge stripe structure, when the equivalent refractive index of the region of the active layer located under the ridge is denoted by Na, and the equivalent refractive index of the other regions of the active layer which are not located under the ridge is denoted by Nb, the difference in the equivalent refractive index is Na−Nb.

DESCRIPTION OF PREFERRED EMBODIMENTS

Embodiments of the present invention are explained in detail below with reference to drawings.

First Embodiment

Figure 1A:
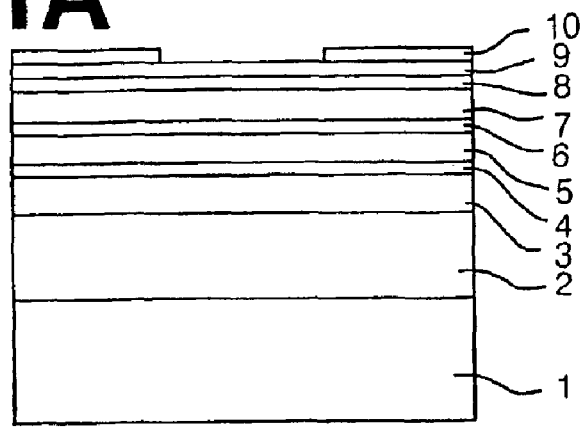
FIGS. 1A to 1C are cross-sectional views of representative stages in a process for producing a semiconductor laser element as a first embodiment.
Figure 1B:
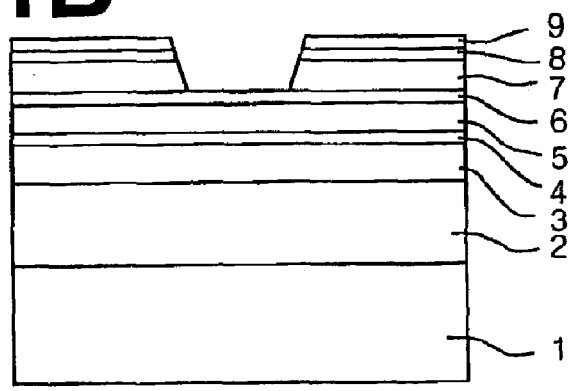
Figure 1C:
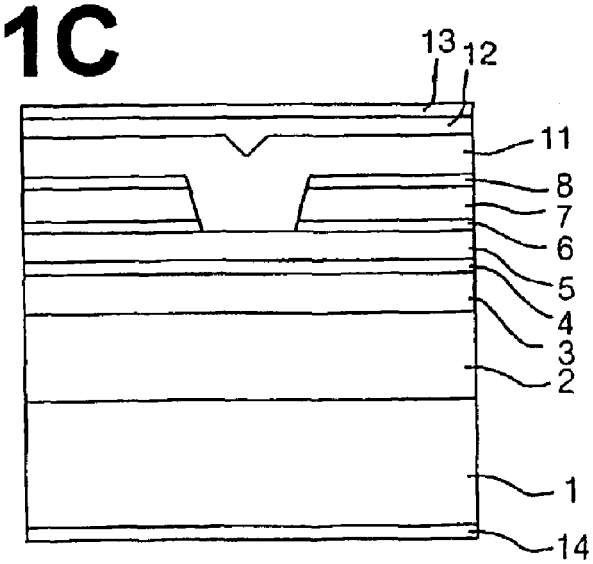

The semiconductor laser element as the first embodiment of the present invention is explained below along a manufacturing process of the semiconductor laser element. FIGS. 1A to 1C are cross-sectional views of representative stages in a process for producing the semiconductor laser element as the first embodiment.

As illustrated in FIG. 1A, by organometallic vapor phase epitaxy, an n-type $Al_{z1}Ga_{1-z1}As$ lower cladding layer 2 ($0.6 \leq z1 \leq 0.8$) is grown on an n-type GaAs substrate 1 at 700° C., and then an n-type or i-type $In_{0.49}Ga_{0.51}P$ lower optical waveguide layer 3 is grown while lowering the temperature from 700° C. to 650° C. Subsequently, an $In_{x3}Ga_{1-x3}As_{1-y3}P_{y3}$ quantum-well active layer 4 ($0<x3 \leq 0.3$, $0 \leq y3 \leq 0.5$) which lattice-matches with GaAs is grown at 650° C., and then a p-type or i-type $In_{0.49}Ga_{0.51}P$ upper optical waveguide layer 5 is grown while raising the temperature from 650° C. to 700° C. Thereafter, a p-type GaAs etching stop layer 6 having a thickness of about 10 nm, an n-type $In_{0.49}(Al_{z2}Ga_{1-z2})_{0.51}P$ current confinement layer 7 ($0.05 \leq z2 \leq 1.0$) having a thickness of about 1 micrometer, an n-type $In_{0.49}Ga_{0.51}P$ first cap layer 8 having a thickness of about 10 nm, an n-type GaAs second cap layer 9 having a thickness of about 10 nm, and a $SiO_2$ film 10 are formed in this order, and a stripe area of the $SiO_2$ film 10 having a width of about 1 to 4 micrometers and extending in the (011) direction is removed.

Next, as illustrated in FIG. 1B, a stripe area of the n-type GaAs second cap layer 9 exposed through the removed stripe area of the $SiO_2$ film 10 is etched with a sulfuric acid etchant by using the remaining areas of the $SiO_2$ film 10 as a mask, and then the remaining areas of the $SiO_2$ film 10 are removed with a fluoric acid etchant. Subsequently, stripe areas of the n-type $In_{0.49}Ga_{0.51}P$ first cap layer 8 and the n-type $In_{0.49}(Al_{z2}Ga_{1-z2})_{0.51}P$ current confinement layer 7 under the removed stripe area of the n-type GaAs second cap layer 9 are etched with a hydrochloric acid etchant so as to expose a stripe area of the p-type GaAs etching stop layer 6 under the removed area of the n-type $In_{0.49}(Al_{z2}Ga_{1-z2})_{0.51}P$ current confinement layer 7.

Thereafter, as illustrated in FIG. 1C, the exposed area of the p-type GaAs etching stop layer 6 and the remaining areas of the n-type GaAs second cap layer 9 are etched off with a sulfuric acid etchant, and then a p-type $Al_{z1}Ga_{1-z1}As$ upper cladding layer 11, a p-type GaAs contact layer 12, a p electrode 13 are formed. In addition, the back surface of the substrate 1 is polished, and an n electrode 14 is formed on the polished surface of the substrate 1. Then, both end surfaces of the layered construction are cleaved, and a high reflectance coating and a low reflectance coating are provided on the respective end surfaces so as to form a resonator. Finally, the above construction is formed into a chip of a semiconductor laser element.

In the above construction, the thickness of the p-type or i-type $In_{0.49}Ga_{0.51}P$ upper optical waveguide layer 5 and the composition of the n-type $In_{0.49}(Al_{z2}Ga_{1-z2})_{0.51}P$ current confinement layer 7 are arranged so that oscillation in a fundamental transverse mode can be maintained even when the output power becomes high.

Alternatively, the lower cladding layer 2 and the upper cladding layer 11 may be made of $In_{0.49}(Ga_{1-z3}Al_{z3})_{0.51}P$ ($0.2 \leq z3 \leq 1$).

In addition, the conductivities of the $In_{0.49}Ga_{0.51}P$ first cap layer 8, the GaAs second cap layer 9, and the GaAs etching stop layer 6 may be either n-type or p-type.

In the semiconductor laser element as the first embodiment, the n-type or i-type $In_{0.49}Ga_{0.51}P$ lower optical waveguide layer 3 is grown while lowering the growth temperature from 700° C. to 650° C. Therefore, the n-type or i-type $In_{0.49}Ga_{0.51}P$ lower optical waveguide layer 3 has a bandgap which gradually decreases with elevation within the n-type or i-type $In_{0.49}Ga_{0.51}P$ lower optical waveguide layer 3 from about 1.92 eV to about 1.85 eV. In addition, the p-type or i-type $In_{0.49}Ga_{0.51}P$ upper optical waveguide layer 5 is grown while raising the growth temperature from 650° C. to 700° C. Therefore, the p-type or i-type $In_{0.49}Ga_{0.51}P$ upper optical waveguide layer 5 has a bandgap which gradually increases with elevation within the p-type or i-type $In_{0.49}Ga_{0.51}P$ upper optical waveguide layer 5 from about 1.85 eV to about 1.92 eV. According to this structure, the electrical resistances at the interfaces between the optical waveguide layers and the layers adjacent to the optical waveguide layers are reduced. Therefore, the electrical resistance of the entire semiconductor laser element is reduced, and the electric and temperature characteristics of the semiconductor laser element are improved.

Figure 2:
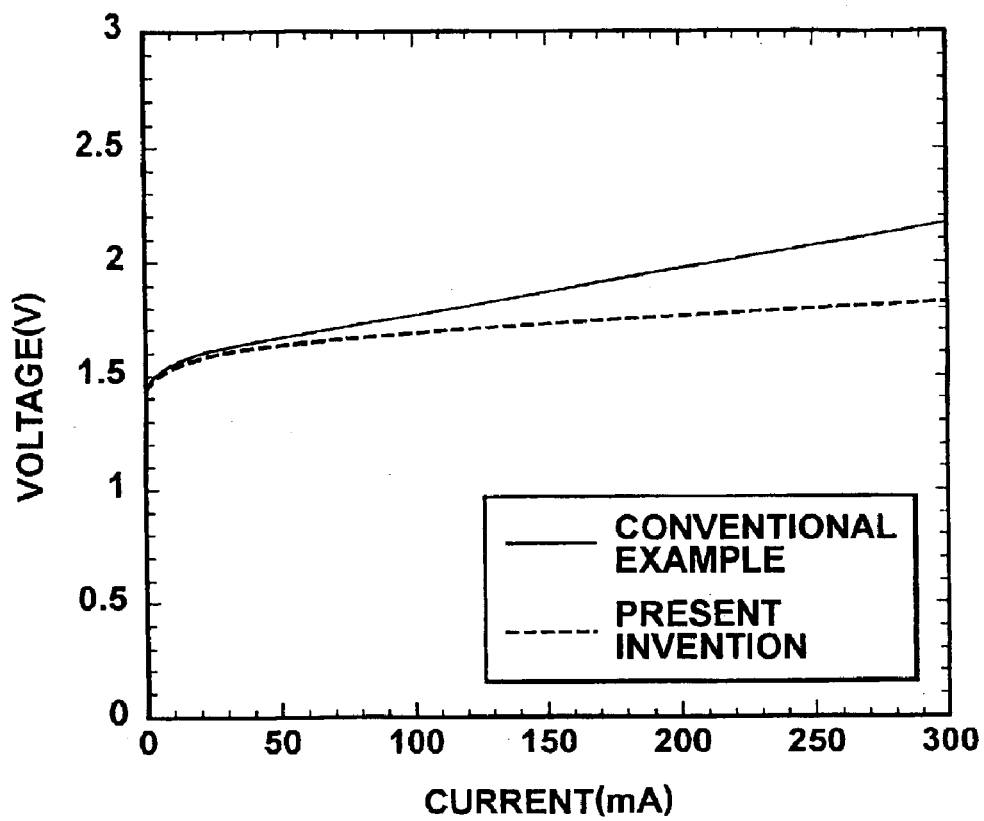
FIG. 2 is a graph indicating current-voltage characteristics of a semiconductor laser element according to the present invention and a conventional semiconductor laser element.

The present inventor have measured current-voltage characteristics of a semiconductor laser element according to the present invention and a conventional semiconductor laser element. The result of the measurement is indicated in FIG. 2. The measured semiconductor laser element according to the present invention is an example of the semiconductor laser element as the first embodiment. In the measured example, the stripe width is 50 micrometers, the Al composition Z1 of the cladding layers is 0.65, the total thickness of the optical waveguide layers is 200 nm, the Al composition Z2 of the current confinement layer is 0.4, the thickness of the active layer is 10 nm, and the composition of active layer is such that x3=0.12 and y3=0.25. The conventional semiconductor laser element in the measurement has a layer structure similar to the above example of the semiconductor laser element as the first embodiment except that the bandgaps of the $In_{0.49}Ga_{0.51}P$ optical waveguide layers are uniform. As illustrated in FIG. 2, due to the gradual variations of the bandgaps of the $In_{0.49}Ga_{0.51}P$ optical waveguide layers, the electrical resistance is decreased by about 20%.

Second Embodiment

Figure 3:
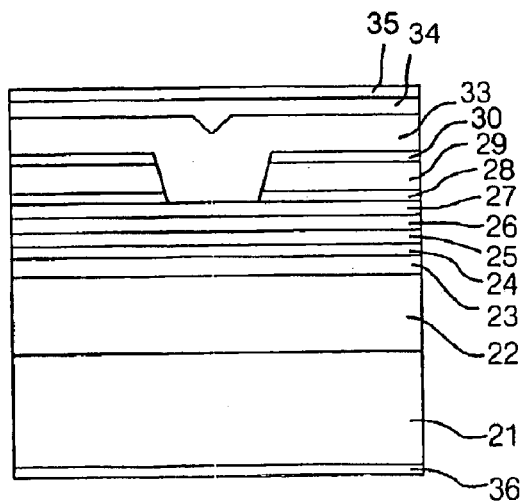
FIG. 3 is a cross-sectional view of a semiconductor laser element as a second embodiment of the present invention.

The semiconductor laser element as the second embodiment of the present invention is explained below along a manufacturing process of the semiconductor laser element. FIG. 3 is a cross-sectional view of the semiconductor laser element as the second embodiment.

As illustrated in FIG. 3, by organometallic vapor phase epitaxy, an n-type $Al_{z1}Ga_{1-z1}As$ lower cladding layer 22 ($0.6 \leq z1 \leq 0.8$) is grown on an n-type GaAs substrate 21 at 700° C., and then an n-type or i-type $In_{0.49}Ga_{0.51}P$ lower optical waveguide layer 23 is grown while lowering the temperature from 700° C. to 600° C. Subsequently, an $In_{x3}Ga_{1-x3}As_{1-y3}P_{y3}$ quantum-well active layer 24 ($0<x3 \leq 0.3$, $0 \leq y3<0.5$) which lattice-matches with GaAs is grown at 600° C., and then a p-type or i-type $In_{0.49}Ga_{0.51}P$ upper optical waveguide layer 25 is grown while raising the temperature from 600° C. to 700° C. Thereafter, a p-type $Al_{z1}Ga_{1-z1}As$ first upper cladding layer 26, a p-type $In_{0.49}Ga_{0.51}P$ first etching stop layer 27 having a thickness of about 10 nm, a p-type GaAs second etching stop layer 28 having a thickness of about 10 nm, an n-type $In_{0.49}(Al_{z2}Ga_{1-z2})_{0.51}P$ current confinement layer 29 ($0.05 \leq z2 \leq 1.0$) having a thickness of about 1 micrometer, an n-type $In_{0.49}Ga_{0.51}P$ first cap layer 30, and an n-type GaAs second cap layer (not shown) are formed in this order.

Next, a $SiO_2$ film (not shown) is formed over the above layered construction, and a stripe area of the $SiO_2$ film having a width of about 1 to 4 micrometers and extending in the (011) direction is removed. Then, a stripe area of the n-type GaAs second cap layer exposed through the removed stripe area of the S102 film is etched with a sulfuric acid etchant by using the remaining areas of the $SiO_2$ film as a mask, and the remaining areas of the $SiO_2$ film are removed with a fluoric acid etchant. Subsequently, stripe areas of the n-type $In_{0.49}Ga_{0.51}P$ first cap layer 30 and the n-type $In_{0.49}(Al_{z2}Ga_{1-z2})_{0.51}P$ current confinement layer 29 under the removed stripe area of the n-type GaAs second cap layer are etched with a hydrochloric acid etchant so as to expose a stripe area of the p-type GaAs second etching stop layer 28 under the removed area of the n-type $In_{0.49}(Al_{z2}Ga_{1-z2})_{0.51}P$ current confinement layer 29, and the exposed stripe area of the p-type GaAs second etching stop layer 28 and the remaining areas of the n-type GaAs second cap layer are etched off with a sulfuric acid etchant so as to form a stripe groove.

Thereafter, a p-type $Al_{z1}Ga_{1-z1}As$ second upper cladding layer 33, a p-type GaAs contact layer 34, a p electrode 35 are formed. In addition, the back surface of the substrate 21 is polished, and an n electrode 36 is formed on the polished surface of the substrate 21. Then, both ends of the layered construction are cleaved, and a high reflectance coating and a low reflectance coating are provided on the respective end facets so as to form a resonator. Finally, the above construction is formed into a chip of a semiconductor laser element.

In the above construction, the thickness and the composition of the p-type $Al_{z1}Ga_{1-z1}As$ first upper cladding layer 26 and the composition of the n-type $In_{0.49}(Al_{z2}Ga_{1-z2})_{0.51}P$ current confinement layer 29 are arranged so that oscillation in a fundamental transverse mode can be maintained even when the output power becomes high.

Alternatively, the second upper cladding layer 33 may be made of $In_{0.49}(Ga_{1-z3}Al_{z3})_{0.51}P$. At this time, it is preferable that $0.2 \leq z3 \leq z2$.

In addition, the conductivities of the $In_{0.49}Ga_{0.51}P$ first cap layer 30, the GaAs second cap layer 31, and the GaAs second etching stop layer 28 may be either n-type or p-type.

In the semiconductor laser element as the second embodiment, the n-type or i-type $In_{0.49}Ga_{0.51}P$ lower optical waveguide layer 23 is grown while lowering the growth temperature from 700° C. to 600° C. Therefore, the n-type or i-type $In_{0.49}Ga_{0.51}P$ lower optical waveguide layer 23 has a bandgap which gradually decreases with elevation within the n-type or i-type $In_{0.49}Ga_{0.51}P$ lower optical waveguide layer 23 from about 1.92 eV to about 1.85 eV. In addition, the p-type or i-type $In_{0.49}Ga_{0.51}P$ upper optical waveguide layer 25 is grown while raising the growth temperature from 600° C. to 700° C. Therefore, the p-type or i-type $In_{0.49}Ga_{0.51}P$ upper optical waveguide layer 25 has a bandgap which gradually increases with elevation within the p-type or i-type $In_{0.49}Ga_{0.51}P$ upper optical waveguide layer 25 from about 1.85 eV to about 1.92 eV. Therefore, a similar effect to the first embodiment is achieved.

Third Embodiment

Figure 4:
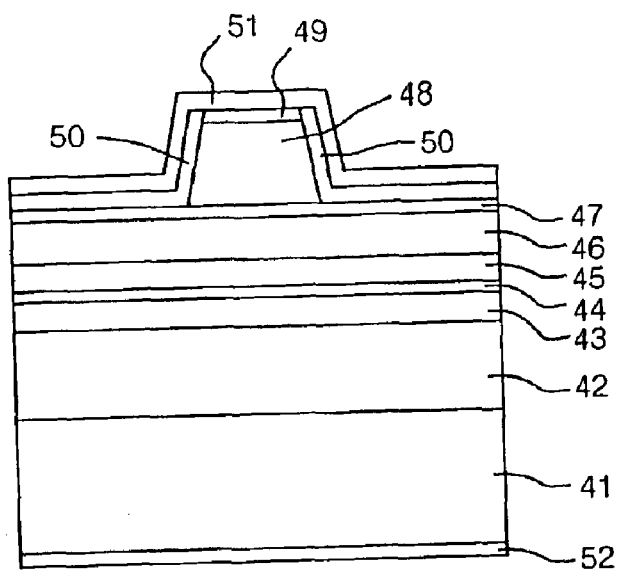
FIG. 4 is a cross-sectional view of a semiconductor laser element as a third embodiment of the present invention.

The semiconductor laser element as the third embodiment of the present invention is explained below along a manufacturing process of the semiconductor laser element. FIG. 4 is a cross-sectional view of the semiconductor laser element as the third embodiment.

As illustrated in FIG. 4, by organometallic vapor phase epitaxy, an n-type $Al_{z1}Ga_{1-z1}As$ lower cladding layer 42 ($0.6 \leq z1 \leq 0.8$) is grown on an n-type GaAs substrate 41 at 700° C., and then an n-type or i-type $In_{0.49}Ga_{0.51}P$ lower optical waveguide layer 43 is grown while lowering the temperature from 700° C. to 650° C. Subsequently, an $In_{x3}Ga_{1-x3}As_{1-y3}P_{y3}$ quantum-well active layer 44 ($0<x3\leq 0.3$, $0\leq y3\leq 0.5$) which lattice-matches with GaAs is grown at 650° C., and then a p-type or i-type $In_{0.49}Ga_{0.51}P$ upper optical waveguide layer 45 is grown while raising the temperature from 650° C. to 700° C. Thereafter, a p-type $Al_{z1}Ga_{1-z1}As$ first upper cladding layer 46, a p-type $In_{0.49}Ga_{0.51}P$ etching stop layer 47 having a thickness of about 10 nm, a p-type $Al_{z1}Ga_{1-z1}As$ second upper cladding layer 48, and a p-type GaAs contact layer 49 are formed in this order.

Next, a first $SiO_2$ film (not shown) is formed over the above layered construction, and the first $SiO_2$ film except for a stripe area of the first $SiO_2$ film having a width of about 4 micrometers and extending in the (011) direction is removed. Then, the p-type GaAs contact layer 49 and the p-type $Al_{z1}Ga_{1-z1}As$ second upper cladding layer 48 are etched with a sulfuric acid etchant by using the remaining stripe area of the first $SiO_2$ film as a mask so as to leave stripe areas of the p-type GaAs contact layer 49 and the p-type $Al_{z1}Ga_{1-z1}As$ second upper cladding layer 48 under the stripe area of the first $SiO_2$ film and form a ridge stripe. At this time, the etching automatically stops at the upper boundary of the p-type $In_{0.49}Ga_{0.51}P$ etching stop layer 47. After the remaining area of the first $SiO_2$ film are removed with a fluoric acid etchant, a second $SiO_2$ film 50 is formed. Then, a stripe area of the second $SiO_2$ film 50 at the top of the ridge stripe is removed by conventional photolithography, and a p electrode 51 is formed. In addition, the back surface of the substrate 41 is polished, and an n electrode 52 is formed on the polished surface of the substrate 41. Then, both ends of the layered construction are cleaved, and a high reflectance coating and a low reflectance coating are provided on the respective end facets so as to form a resonator. Finally, the above construction is formed into a chip of a semiconductor laser element.

In the above construction, the thickness and the composition of the p-type $Al_{z1}Ga_{1-z1}As$ first upper cladding layer 46 are arranged so that oscillation in a fundamental transverse mode can be maintained even when the output power becomes high.

Alternatively, the second upper cladding layer 48 may be made of $In_{0.49}(Ga_{1-z3}Al_{z3})_{0.51}P$, where $0.2 \leq z3 \leq 1$. At this time, the p-type etching stop layer 47 can be made of GaAs instead of $In_{0.49}Ga_{0.51}P$.

Fourth Embodiment

Figure 5:
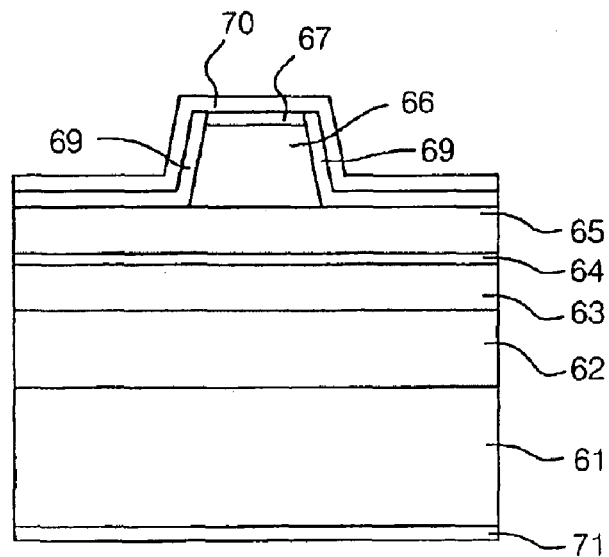
FIG. 5 is a cross-sectional view of a semiconductor laser element as a fourth embodiment of the present invention.

The semiconductor laser element as the fourth embodiment of the present invention is explained below along a manufacturing process of the semiconductor laser element. FIG. 5 is a cross-sectional view of the semiconductor laser element as the fourth embodiment.

As illustrated in FIG. 5, by organometallic vapor phase epitaxy, an n-type $Al_{z1}Ga_{1-z1}As$ lower cladding layer 62 ($0.6 \leq z1 \leq 0.8$) is grown on an n-type GaAs substrate 61 at 700° C., and then an n-type or i-type $In_{0.49}Ga_{0.51}P$ lower optical waveguide layer 63 is grown while lowering the temperature from 700° C. to 650° C. Subsequently, an $In_{x3}Ga_{1-x3}As_{1-y3}P_{y3}$ quantum-well active layer 64 ($0<x3\leq 0.3$, $0\leq y3\leq 0.5$) which lattice-matches with GaAs is grown at 650° C. and then a p-type or i-type $In_{0.49}Ga_{0.51}P$ upper optical waveguide layer 65 is grown while raising the temperature from 650° C. to 700° C. Thereafter, a p-type $Al_{z1}Ga_{1-z1}As$ upper cladding layer 66 and a p-type GaAs contact layer 67 are formed in this order.

Next, a first $SiO_2$ film (not shown) is formed over the above layered construction, and the first $SiO_2$ film except for a stripe area of the first $SiO_2$ film having a width of about 4 micrometers and extending in the (011) direction is removed. Then, the p-type GaAs contact layer 67 and the p-type $Al_{z1}Ga_{1-z1}As$ upper cladding layer 66 are etched with a sulfuric acid etchant by using the remaining stripe area of the first $SiO_2$ film as a mask so as to leave stripe areas of the p-type GaAs contact layer 67 and the p-type $Al_{z1}Ga_{1-z1}As$ upper cladding layer 66 under the stripe area of the first $SiO_2$ film and form a ridge stripe. At this time, the etching automatically stops at the upper boundary of the p-type or i-type $In_{0.49}Ga_{0.51}P$ upper optical waveguide layer 65. After the remaining area of the first $SiO_2$ film are removed with a fluoric acid etchant, a second $SiO_2$ film 69 is formed. Then, a stripe area of the second $SiO_2$ film 69 at the top of the ridge stripe is removed by conventional photolithography, and a p electrode 70 is formed. In addition, the back surface of the substrate 61 is polished, and an n electrode 71 is formed on the polished surface of the substrate 61. Then, both ends of the layered construction are cleaved, and a high reflectance coating and a low reflectance coating are provided on the respective end facets so as to form a resonator. Finally, the above construction is formed into a chip of a semiconductor laser element.

In the above construction, the thickness of the p-type or i-type $In_{0.49}Ga_{0.51}P$ upper optical waveguide layer 65 and the composition of the p-type $A_{z1}Ga_{1-z1}As$ upper cladding layer 66 are arranged so that oscillation in a fundamental transverse mode can be maintained even when the output power becomes high.

Alternatively, the p-type upper cladding layer 66 may be made of $In_{0.49}(Ga_{1-z3}Al_{z3})_{0.51}P$, where $0.2 \leq z3 \leq 1$. In this case, it is preferable to arrange an etching stop layer made of GaAs between the p-type or i-type $In_{0.49}Ga_{0.51}P$ upper optical waveguide layer 65 and the p-type upper cladding layer 66. Further, it is possible to arrange a second upper cladding layer made of p-type $Al_{z1}Ga_{1-z1}As$ or $In_{0.49}(Ga_{1-z3}Al_{z3})_{0.51}P$ ($0.2 \leq z3 \leq 1$) between the p-type or i-type $In_{0.49}Ga_{0.51}P$ upper optical waveguide layer 65 and the above etching stop layer. In this case, the controllability of the difference in the equivalent refractive index between a portion of the active layer under the ridge stripe region and the other portions of the active layer can be increased.

Additional Matters (i) Since the semiconductor laser elements as the first to fourth embodiments have an $In_{x3}Ga_{1-x3}As_{1-y3}P_{y3}$ active layer ($0<x3\leq0.3$, $0\leq y3\leq0.5$), which lattice-matches with GaAs, the oscillation wavelengths of the semiconductor laser elements can be controlled in the range between 720 and 860 nm.

(ii) Although n-type GaAs substrates are used in the constructions of the first to fourth embodiments, instead, p-type GaAs substrates may be used. When the GaAs substrates are p-type, the conductivity types of all of the other layers in the constructions of the first to fourth embodiments should be inverted.

(iii) Although the semiconductor laser elements as the first to fourth embodiments are index-guided semiconductor laser elements, the present invention can also be applied to semiconductor laser elements having a diffraction grating and semiconductor laser elements formed in integrated circuits.

(iv) The semiconductor laser elements as the first to fourth embodiments have a stripe width of about 1 to 4 micrometers, and are designed for oscillation in a fundamental transverse mode. In this case, when the difference in the equivalent refractive index between a portion of the active layer under the stripe region and the other portions of the active layer is controlled within a range of $2\times10^{-3}$ to $7\times10^{-3}$, oscillation in a fundamental transverse mode can be maintained even when the output power becomes high. The present invention can also be applied to index-guided semiconductor laser elements having a stripe width greater than 4 micrometers. In this case, when the difference in the equivalent refractive index between a portion of the active layer under the stripe region and the other portions of the active layer is controlled to be equal to or greater than $2\times10^{-3}$, low-noise laser oscillation can be achieved even in multiple modes.

(v) Each layer in the constructions of the above embodiments may be formed by molecular beam epitaxy using a solid or gas raw material.

(vi) Since the semiconductor laser elements according to the present invention have low element resistance, excellent characteristics, and high reliability, the semiconductor laser elements according to the present invention can be used as a light source in the fields of high-speed, information processing, image processing, communications, laser measurement, medicine, printing, and the like.

(vii) All of the contents of the Japanese patent application No. 2002-136515 are incorporated into this specification by reference.

What is claimed is:

1. A semiconductor laser element comprising:
   a substrate of a first conductive type;
   a lower cladding layer of the first conductive type, formed above said substrate;
   a lower optical waveguide layer formed above said lower cladding layer, and made of $In_{0.49}Ga_{0.51}P$ which is undoped or the first conductive type;
   an active layer which is formed above said lower optical waveguide layer, and made of $In_{x3}Ga_{1-x3}As_{1-y3}P_{y3}$ lattice-matching with GaAs, where $0<x3\leq0.3$ and $0\leq y3\leq0.5$;
   an upper optical waveguide layer formed above said active layer, and made of $In_{0.49}Ga_{0.51}P$ which is undoped or a second conductive type; and
   an upper cladding layer of the second conductive type, formed above said upper optical waveguide layer;
   wherein said lower optical waveguide layer has a bandgap which gradually decreases with increase in elevation within the lower optical waveguide layer, and said upper optical waveguide layer has a bandgap which gradually increases with increase in elevation within the upper optical waveguide layer.

2. A semiconductor laser element according to claim 1, wherein
   said substrate is made of GaAs,
   said lower cladding layer and said upper cladding layer are made of $Al_{z1}Ga_{1-z1}As$ or $In_{0.49}(Ga_{1-z3}Al_{z3})_{0.51}P$, where $0.6 \leq z1 \leq 0.8$ and $0.2 \leq z3 \leq 1$,
   an etching stop layer made of GaAs of the first or second conductive type, a current confinement layer of $In_{0.49}(Ga_{1-z2}Al_{z2})_{0.51}P$ of the first conductive type, and a cap layer made of InGaP of the first or second conductive type are formed in this order on said upper optical waveguide layer other than an area of the upper optical waveguide layer corresponding to a current injection region so as to form a stripe groove, where $0.05 \leq z2 \leq 1$, and said upper cladding layer and said cap layer are formed in this order so as to fill said stripe groove.

3. A semiconductor laser element according to claim 2, further comprising, between said upper optical waveguide layer and said etching stop layer, another upper cladding layer made of $Al_{z1}Ga_{1-z1}As$ or $In_{0.49}(Ga_{1-z3}Al_{z3})_{0.51}P$ of the second conductive type, where $0.6 \leq z1 \leq 0.8$ and $0.2 \leq z3 \leq 1$, and another etching stop layer made of InGaP of the second conductive type and formed above said another upper cladding layer.

4. A semiconductor laser element according to claim 1, wherein said substrate is made of GaAs, said lower cladding layer is made of $Al_{z1}Ga_{1-z1}As$ or $In_{0.49}(Ga_{1-z3}Al_{z3})_{0.51}P$, where $0.6 \leq z1 \leq 0.8$ and $0.2 \leq z3 \leq 1$, said upper cladding layer is made of $Al_{z1}Ga_{1-z1}As$, where $0.6 \leq z1 \leq 0.8$, and a ridge stripe is formed by removing portions of layers formed above at least a portion of said upper optical waveguide layer which does not correspond to a current injection region.

5. A semiconductor laser element according to claim 4, further comprising, between said upper optical waveguide layer and said upper cladding layer, another upper cladding layer made of $Al_{z1}Ga_{1-z1}As$ or $In_{0.49}(Ga_{1-z3}Al_{z3})_{0.51}P$ of the second conductive type, where $0.6 \leq z1 \leq 0.8$ and $0.2 \leq z3 \leq 1$, and an etching stop layer made of InGaP and formed above said another upper cladding layer.

6. A semiconductor laser element according to claim 1, wherein said substrate is made of GaAs, said lower cladding layer is made of $Al_{z1}Ga_{1-z1}As$ or $In_{0.49}(Ga_{1-z3}Al_{z3})_{0.51}P$, where $0.6 \leq z1 \leq 0.8$ and $0.2 \leq z3 \leq 1$, said upper cladding layer is made of $In_{0.49}(Ga_{1-z3}Al_{z3})_{0.51}P$, where $0.2 \leq z3 \leq 1$, an etching stop layer made of GaAs is formed between said upper cladding layer and said upper optical waveguide layer, and a ridge stripe is formed by removing portions of layers formed above at least a portion of said etching stop layer which does not correspond to a current injection region.

7. A semiconductor laser element according to claim 6, further comprising, between said upper optical waveguide layer and said etching stop layer, another upper cladding layer made of $Al_{z1}Ga_{1-z1}As$ or $In_{0.49}(Ga_{1-z3}Al_{z3})_{0.51}P$ of the second conductive type, where $0.6 \leq z1 \leq 0.8$ and $0.2 \leq z3 \leq 1$.

8. A semiconductor laser element according to claim 2, wherein said stripe groove has a width of 1 to 4 micrometers, and a difference in an equivalent refractive index between a portion of the active layer under the stripe groove and other portions of the active layer is in a range of $2 \times 10^{-3}$ to $7 \times 10^{-3}$.

9. A semiconductor laser element according to claim 4, wherein said ridge stripe has a width of 1 to 4 micrometers, and a difference in an equivalent refractive index between a portion of the active layer under the ridge stripe and other portions of the active layer is in a range of $2 \times 10^{-3}$ to $7 \times 10^{-3}$.

10. A semiconductor laser element according to claim 6, wherein said ridge stripe has a width of 1 to 4 micrometers, and a difference in an equivalent refractive index between a portion of the active layer under the ridge stripe and other portions of the active layer is in a range of $2 \times 10^{-3}$ to $7 \times 10^{-3}$.

11. A semiconductor laser element according to claim 2, wherein said stripe groove has a width greater than 4 micrometers, and a difference in an equivalent refractive index between a portion of the active layer under the stripe groove and other portions of the active layer is equal to or greater than $2 \times 10^{-3}$.

12. A semiconductor laser element according to claim 4, wherein said ridge stripe has a width greater than 4 micrometers, and a difference in an equivalent refractive index between a portion of the active layer under the ridge stripe and other portions of the active layer is equal to or greater than $2 \times 10^{-3}$.

13. A semiconductor laser element according to claim 6, wherein said ridge stripe has a width greater than 4 micrometers, and a difference in an equivalent refractive index between a portion of the active layer under the ridge stripe and other portions of the active layer is equal to or greater than $2 \times 10^{-3}$.

* * * * *